United States Patent [19]

Takekawa et al.

[11] Patent Number: 4,714,952
[45] Date of Patent: Dec. 22, 1987

[54] CAPACITOR BUILT-IN INTEGRATED CIRCUIT PACKAGED UNIT AND PROCESS OF FABRICATION THEREOF

[75] Inventors: Kouichi Takekawa; Manabu Bonkohara, both of Tokyo, Japan

[73] Assignee: NEC Corporation, Japan

[21] Appl. No.: 792,971

[22] Filed: Oct. 30, 1985

[30] Foreign Application Priority Data

Nov. 1, 1984 [JP] Japan .................... 59-230954

[51] Int. Cl.⁴ .................... H05K 03/46
[52] U.S. Cl. .................... 357/75; 357/70; 357/74; 174/52 FP; 174/42; 361/402; 361/421
[58] Field of Search .................... 174/52 FP, 52 S; 361/421, 402; 357/70, 74, 80, 75

[56] References Cited

U.S. PATENT DOCUMENTS

| | | | |
|---|---|---|---|
| 3,268,778 | 8/1966 | Worsham | 174/52 FP |
| 3,628,105 | 12/1971 | Sakai et al. | 174/52 FP |
| 3,699,011 | 10/1972 | Nishimura | 361/402 x |
| 3,713,006 | 1/1973 | Litty et al. | 357/74 x |
| 4,188,652 | 2/1980 | Smolko | 361/402 |
| 4,437,140 | 3/1984 | Ohyama et al. | 361/402 |
| 4,445,274 | 5/1984 | Suzuki et al. | 357/80 x |
| 4,451,845 | 5/1984 | Philofsky | 357/80 x |
| 4,459,607 | 7/1984 | Reid | 357/71 R |
| 4,524,238 | 6/1985 | Butt | 174/52 FP |
| 4,534,105 | 8/1985 | Reusch | 357/70 x |
| 4,577,214 | 3/1986 | Schaper | 357/70 x |

FOREIGN PATENT DOCUMENTS

| | | | |
|---|---|---|---|
| 0045877 | 2/1982 | European Pat. Off. | 361/402 |
| 2495837 | 11/1982 | France | 174/52 FP |
| 56-99864 | 8/1981 | Japan . | |
| 56-129348 | 10/1981 | Japan . | |
| 57-113261 | 7/1982 | Japan . | |

*Primary Examiner*—R. R. Kucia
*Attorney, Agent, or Firm*—Laff, Whitesel, Conte & Saret

[57] ABSTRACT

A capacitor built-in integrated circuit packaged unit comprising an electrically conductive support member, first and second lead elements associated with the conductive support member, a stack of a plurality of layers comprising a first insulating layer of a highly dielectric material formed on the conductive support member, an electrically conductive layer on the first insulating layer, and a second insulating layer on the conductive layer, the conductive layer having a portion exposed by the second insulating layer, a semiconductor integrated circuit chip having first and second electrodes which are electrically isolated from each other, the second insulating layer intervening between the conductive layer and the semiconductor integrated circuit chip, a bonding wire electrically connecting the first electrode to the first lead element, and a bonding wire electrically connecting the second electrode to the exposed portion of the conductive layer and to the second lead element. The dielectric material forming the first insulating layer provides a capacitor between the first and second electrodes on the semiconductor integrated circuit chip.

22 Claims, 13 Drawing Figures

CAPACITOR BUILT-IN INTEGRATED CIRCUIT PACKAGED UNIT AND PROCESS OF FABRICATION THEREOF

FIELD OF THE INVENTION

The present invention relates to a capicitor built-in integrated circuit packaged unit and a process of fabricating such an integrated circuit packaged unit.

DESCRIPTION OF THE PRIOR ART

Where semiconductor integrated circuits are used to implement an electronic device, a discrete capacitor is frequently used between the supply and ground leads of each of the semiconductor integrated circuits to preclude occurrences of unwanted actions due to creation of noises between the leads. Provision of such a discrete capacitor outside each semiconductor integrated circuit leads to a problem in that the effect of the capacitor is more or less degraded by the inductance induced by the lead wires between the capacitor and the integrated circuit device. Another problem inherent in a semiconductor integrated circuit with a discrete capacitor is that the print-circuit assembly constructed of a number of integrated circuit devices each combined with a discrete capacitor can not be fabricated with a satisfactory packing density.

An integrated circuit packaged unit with a built-in capacitor has therefore been proposed to provide solutions to these problems. Examples of such a capacitor built-in integrated circuit packaged unit are disclosed in Japanese Patent Publications No. 49-5392, No. 56-99864, No. 56-129348 and No. 57-113261. The capacitor built-in integrated circuit packaged unit shown in one of these publications uses a capacitor sealed in a ceramic package or enclosed within the cavity formed in a ceramic package. Another publication teaches a capacitor built-in integrated circuit packaged unit including a capacitor interposed between layers of a ceramic substrate of a ceramic package. Problems are still encountered in these types of capacitor built-in ceramic packages since such packages are not suitable for production on a large scale commercial basis and since the specific construction of the ceramic packages per se is not applicable to the fabrication of plastic packages.

The present invention contemplates a provision of an improved capacitor built-in integrated circuit packaged unit eliminating all these problems that have been inherent in prior-art capacitor built-in integrated circuit packages.

SUMMARY OF THE INVENTION

In accordance with one outstanding aspect of the present invention, there is provided a capacitor built-in integrated circuit packaged unit comprising an electrically conductive support member, (1) first and second lead elements associated with the conductive support member, (2) a stack of a plurality of layers comprising a first insulating layer of a highly dielectric material formed on the conductive support member, an electrically conductive layer formed on the first insulating layer, and a second insulating layer formed on the conductive layer, the conductive layer having a portion exposed by the second insulating layer, (3) a semiconductor integrated circuit chip having first and second electrodes which are electrically isolated from each other, the second insulating layer intervening between the conductive layer and the semiconductor integrated circuit chip, (4) first coupling means electrically connecting the first electrode to the first lead element, and (5) second coupling means electrically connecting the second electrode to the exposed portion of the conductive layer and to the second lead element.

In accordance with another outstanding aspect of the present invention, a capacitor built-in integrated circuit packaged unit comprises an electrically conductive support member, (1) first and second lead elements associated with the conductive support member, (2) a stack of a plurality of layers comprising a first insulating layer of a highly dielectric material formed on the conductive support member, an electrically conductive layer formed on the first insulating layer, and a second insulating layer formed on the conductive layer, the conductive layer having a portion exposed by the second insulating layer, (3) a semiconductor integrated circuit chip having first and second electrodes which are electrically isolated from each other, the second insulating layer intervening between the conductive layer and the semiconductor integrated circuit chip, (4) first coupling means electrically connecting the first electrode to the first lead element, (5) second coupling means electrically connecting the second electrode to the exposed portion of the conductive layer and to the second lead element, (6) a ceramic package case formed with a concavity having a bottom surface, (7) a metallized layer formed on the bottom surface, the first lead element being fast on the ceramic package case and electrically connected to the metallized layer, (8) the second lead element being fast on the ceramic package case and electrically isolated from the metallized layer, (9) the conductive support member being bonded to the metallized layer with an electrically conductive adhesive material, and (10) a cap member attached to the ceramic package case and closing the concavity.

In accordance with still another outstanding aspect of the present invention, a process of fabricating a capacitor built-in integrated circuit packaged unit, comprises the steps of (1) preparing an electrically conductive support member, first and second lead elements associated with the conductive support member, and a semiconductor integrated circuit chip having first and second electrodes which are electrically isolated from each other, (2) forming a first insulating layer of a highly dielectric material formed on the conductive support member, (3) forming an electrically conductive layer on the first insulating layer, (4) forming a second insulating layer on the conductive layer, the conductive layer having a portion exposed by the second insulating layer, (5) holding the semiconductor integrated circuit chip in position with respect to the conductive support member so that the second insulating layer intervenes between the conductive layer and the semiconductor integrated circuit chip, (6) electrically connecting the first electrode to the first lead element by first coupling means, (7) electrically connecting the second electrode to the exposed portion of the conductive layer and to the second lead element with second coupling means, and (8) sealing the conductive support member, the first and second lead elements, the semiconductor integrated circuit chip, the first and second insulating layers, the conductive layer, and the first and second coupling means with an electrically lowly conductive material.

BRIEF DESCRIPTION OF THE DRAWINGS

The drawbacks of a prior-art capacitor built-in integrated circuit package unit and the features and advantages of an improved capacitor built-in integrated circuit packaged unit, according to the present invention, as well as a process of fabricating such an improved capacitor built-in integrated circuit packaged unit, will be more clearly understood from the following description taken in conjunction with the accompanying drawings in which like reference numerals designate similar or corresponding members and elements and in which.

DESCRIPTION OF THE PRIOR ART

Figure 1:
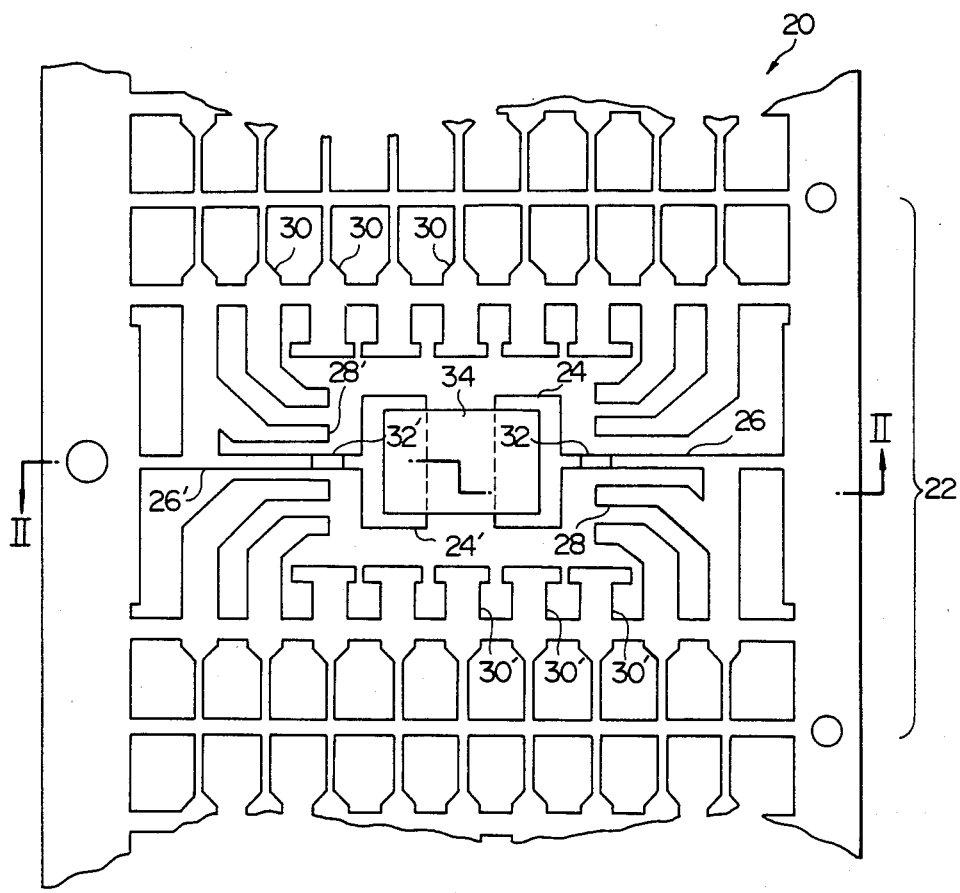
FIG. 1 is a fragmentary plan view showing a portion of a lead frame including a frame section to form part of a prior-art semiconductor integrated circuit packaged unit with a built-in capacitor.

In FIG. 1 of the drawings is shown a generally flat lead frame 20 including a frame section 22 to form part of a prior-art integrated circuit packaged unit with a built-in capacitor. The lead frame 20 in its entirety is in the form of a continuous length of ribbon and usually consists of more than several frame sections which occur in succession longitudinally of the ribbon. The shown section 22 of the lead frame 20 has a pair of spaced chip mounting portions 24 and 24' located in a middle portion of the lead frame section 12 and a pair of elongated strip portions 26 and 26' extending in line with each other and terminating in the chip mounting portions 24 and 24', respectively. First and second outgoing lead portions 28 and 28' extend in parallel with and are connected to the strip portions 26 and 26', respectively, as shown. These lead portions 28 and 28' serve as supply electrodes for the final product of the integrated circuit packaged unit to be fabricated. The lead frame section 22 further has two sets of outgoing lead portions 30 and 30' arranged in parallel on both sides of the chip mounting portions 24 and 24'.

Figure 2:
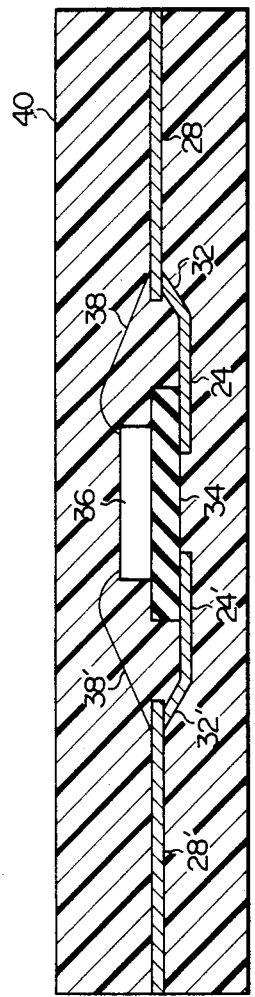
FIG. 2 is a sectional view taken along lines II—II in FIG. 1 and shows the general construction of such a prior-art integrated circuit packaged unit.

As will be better seen from FIG. 2, the strip portions 26 and 26' of the lead frame section 22 thus configured generally step down immediately ahead of the chip mounting portions 24 and 24', respectively, as indicated at 32 and 32', respectively, so that the chip mounting portions 24 and 24' have upper surfaces flush with each other below the plane on which the frame section 22 lies. On these upper surfaces of the chip mounting portions 24 and 24' is positioned a chip-type capacitor 34 which has one of its electrode plates bonded to one of the chip mounting portions 24 and 24' and the other electrode plate bonded to the other chip mounting portion with an electrically conductive adhesive material such as a solder or a metal paste. To the upper surface of the chip-type capacitor 34 is fixedly attached a semiconductor semiconductor integrated circuit chip 36 as shown. The semiconductor semiconductor integrated circuit chip 36 has the various electrodes of its bonding pads connected to the lead portions 28, 28', 30 and 30' of the lead frame section 22 by means of bonding wires 38 and 38' of, usually, gold. The resultant structure consisting of the frame section 22, capacitor 34, semiconductor integrated circuit chip 36 and bonding wires 38 is then sealed in, for example, a body of epoxy resin 40 to implement the desired integrated circuit packaged unit having a built-in capacitor.

The process of fabricating an integrated circuit packaged unit with a built-in capacitor as above described is advantageous in that the chip-type capacitor 34 can be incorporated into the packaged unit using any of process flows established for the fabrication of ordinary semiconductor integrated circuit packaged units. A problem however arises from the fact that the chip-type capacitor 34 must be larger in size than the semiconductor integrated circuit chip 36 per se in such a built-in capacitor packaged unit as will be seen from the illustration of FIG. 2. The chip-type capacitor 34 being thus larger than the semiconductor integrated circuit chip 36, the use of a large-sized semiconductor integrated circuit chip results in unwieldy construction of the packaged unit which must has incorporated therein a built-in capacitor larger than the particular chip. Difficulties are encountered in fabricating such large-sized chip-type capacitors which are usually of extremely thin construction. Having recourse to any expedients to overcome these difficulties in fabricating the chip-type capacitors would give rise to an increase in the production cost of the integrated circuit packaged units. Another problem which would result from the thin construction of a chip-type capacitor is the deficiency of the mechanical strength of the capacitor. Furthermore, the incorporation of the large-sized capacitor in the body of the epoxy resin leads to an increase in the difference between the amounts of thermal expansion of the bulk capacitor and the body of the epoxy resin. This results in significant reduction in the resistance to thermal impact of the semiconductor integrated circuit device and accordingly in the performance reliability of the circuit device.

Figure 3:
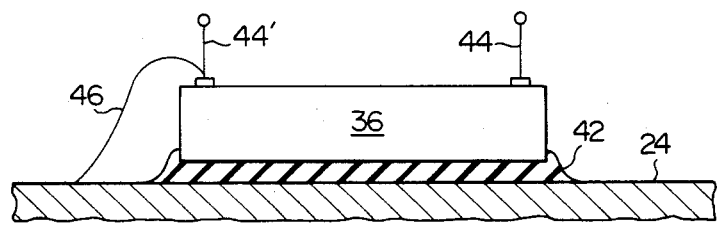
FIG. 3 is a sectional view showing the general construction of another example of a prior-art capacitor built-in integrated circuit packaged unit.

There have been proposed two different approaches to provide solutions to these problems inherent in built-in capacitor integrated circuit packaged units of the described type. The general construction of a built-in capacitor integrated circuit packaged unit fabricated by one of these two methods is illustrated in FIG. 3, wherein the integrated circuit packaged unit is shown including a semiconductor semiconductor integrated circuit chip 36 mounted on a single chip mounting portion 24 of a lead frame section. The semiconductor integrated circuit chip 36 has the lower surface of its substrate (not shown) bonded to the upper surface of the chip mounting portion 24 of the frame section with a layer 42 of a dielectric adhesive material. On the upper surface 36' of the chip 36 opposite to the substrate are formed first and second supply electrodes 44 and 44'. The semiconductor integrated circuit chip 36 is constructed so that the potential to be produced at the first supply electrode 44 is equal to the potential at the lower surface of the substrate of the chip 36. The second supply electrode 44' is electrically isolated from the lower surface of the substrate and is electrically coupled to the chip mounting portion 24 of the lead frame section 22 by means of a bonding wire 46 as shown. Between the first and second supply electrodes 44 and 44' is thus formed a capacitance implemented by the layer 42 of the dielectric adhesive material.

Figure 4:
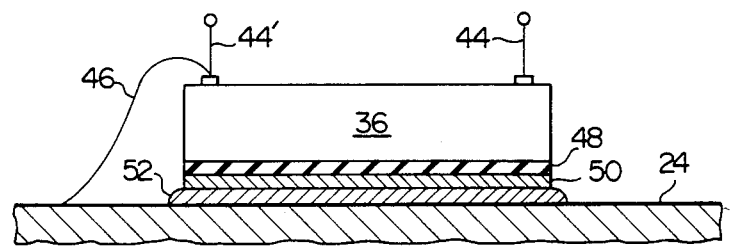
FIG. 4 is a view similar to FIG. 3 but shows the general construction of still another example of a prior-art capacitor built-in integrated circuit packaged unit.

FIG. 4 shows the general construction of a built-in capacitor integrated circuit packaged unit fabricated by the other of the above mentioned two methods, wherein the integrated circuit packaged unit is also shown including a semiconductor semiconductor integrated circuit chip 36 mounted on a single chip mounting portion 24 of a lead frame section. The semiconductor integrated circuit chip 36 has the lower surface of its substrate (not shown) formed with a layer 48 of a dielectric substance which is formed by thermal oxidation or sputtering techniques. The dielectric layer 48 is covered with a conductive layer 50 of metal deposited on the lower surface of the layer 48, and this conductive layer 50 is bonded to the upper surface of the chip mounting portion 24 of the frame section by a layer 52 of an electrically conductive adhesive material. On the upper surface 36' of the semiconductor integrated circuit chip 36 opposite to the substrate are formed first and second supply electrodes 44 and 44'. As in the integrated circuit packaged unit shown in FIG. 3, arrangement is made so that the potential to be produced at the first supply electrode 44 is equal to the potential at the lower surface of the substrate of the chip 36. The second supply electrode 44' is electrically isolated from the lower surface of the substrate and is electrically coupled to the chip mounting portion 24 of the lead frame section 22 by means of a bonding wire 46 as shown. Between the first and second supply electrodes 44 and 44' is thus formed a capacitance implemented by the dielectric layer 48 across the conductive layers 50 and 52.

Problems are, however, still encountered in both of the prior-art integrated circuit packaged units which are thus constructed. In the case of the method used for the fabrication of the prior-art integrated circuit packaged unit shown in FIG. 3, it is extremely difficult to achieve uniformity of thickness in forming the dielectric adhesive layer 42 between the lead frame section and the substrate of the semiconductor integrated circuit chip. If the method of fabricating the integrated circuit packaged unit shown in FIG. 4 is to be used, a problem arises in that the conductive adhesive material to form the layer 50 tends to flow beyond the edges of the dielectric layer 48 to reach the interface between the the dielectric layer 48 and the substrate of the semiconductor integrated circuit chip 36, forming a short circuit between the first and second supply electrodes 44 and 44'. Furthermore, both of the known methods partake of an inconvenience that the application of an integrated circuit packaged unit fabricated by either of these methods is limited to the case where the potential to be produced at one of the two supply electrodes 44 and 44' is equal to the potential at the lower surface of the substrate of the semiconductor integrated circuit chip 36. This means that the integrated circuit packaged units fabricated by either of these methods could not be utilized where the potentials to be established at the lower surfaces of the semiconductor integrated circuit chips are to be selected to be proper to the particular chips.

It is, accordingly, an important object of the present invention to provide an improved capacitor built-in integrated circuit packaged unit which is free from any of the problems inherent in known capacitor built-in integrated circuit packaged units and which is reliable in performance, easy and economical to manufacture and flexible in application.

It is another important object of the present invention to provide a process of fabricating such an improved capacitor built-in integrated circuit packaged unit according to the present invention.

DESCRIPTION OF THE PREFERRED EMBODIMENTS

Figure 5:
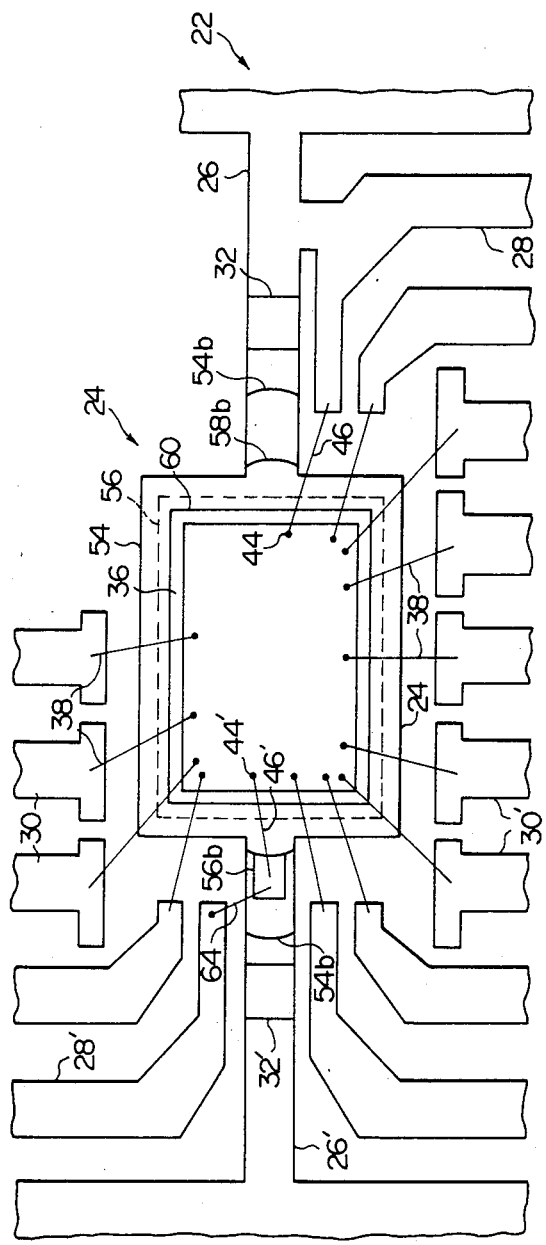
FIG. 5 is a fragmentary plan view showing a portion of a lead frame including a frame section to form part of a first preferred embodiment of a capacitor built-in integrated circuit packaged unit according to the present invention.

Referring to FIG. 5 of the drawings, a capacitor built-in integrated circuit packaged unit embodying the present invention comprises a generally flat metal frame section 22 which has a single chip mounting portion 24 located in a middle portion of the frame section 12, in contrast to the two chip mounting portions 24 and 24' of the lead frame section 22 of the prior-art integrated circuit packaged unit shown in FIG. 1. The lead frame section 22 further has a pair of elongated strip portions 26 and 26' extending in line with each other and terminating in the chip mounting portion 24 in opposite directions. These strip portions 26 and 26' serve not only as leads but also as cantilever supports for the chip mounting portion 24. First and second outgoing lead portions 28 and 28' extend, each in part, in parallel with the strip portions 26 and 26', respectively, of the lead frame section 22 as shown, to serve as supply electrodes for the final product of the integrated circuit packaged unit to be fabricated. The first lead portion 28 is connected to the chip mounting portion 24 through the strip portion 26 of the lead frame section 22, while the second lead portion 28' is assumed to be separate from the chip mounting portion 24 as shown. The lead frame section 22 further has two sets of outgoing lead portions 30 and 30' arranged in parallel on both sides of the chip mounting portion 24. These lead portions 30 and 30' as well as the above mentioned lead portions 28 and 28' are to form pins in the final product.

Figure 6:
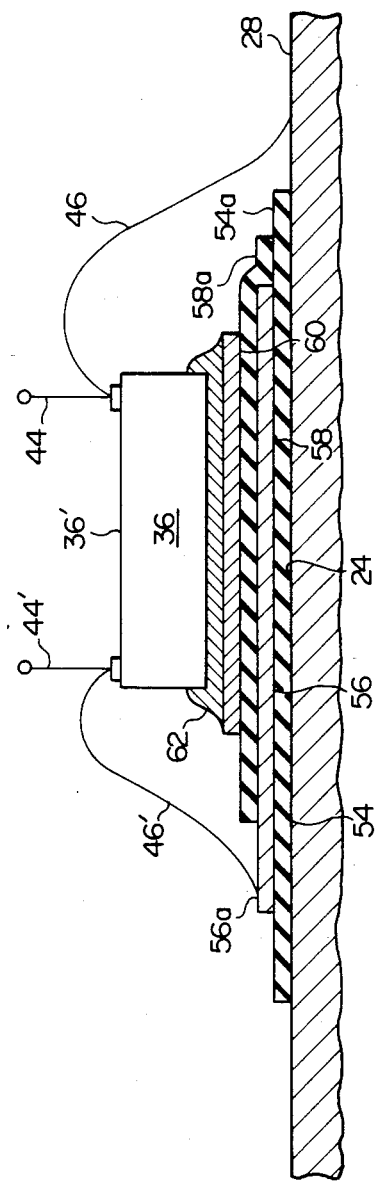
FIG. 6 is a sectional view showing the general construction of an interim structure formed during the process of fabricating the capacitor built-in integrated circuit packaged unit provided by the first embodiment of the present invention.

On the upper surface of the chip mounting portion 24 of the lead frame section 22 thus configured is formed a first insulating layer 54 of a highly dielectric material, as will be further seen from FIG. 6. This first insulating layer 54 has its upper surface covered with a first conductive layer 56 which is formed to leave at least one portion of the upper surface of the insulating layer 54 exposed as indicated at 54a in FIG. 6. The first conductive layer 56 in turn is covered with a second insulating layer 58 which is formed to leave at least one portion of the upper surface of the conductive layer 56 exposed as indicated at 56a and which may lie in part on the exposed portion 54a of the first insulating layer 54 as indicated at 58a in FIG. 6. On the upper surface of the second insulating layer 58 in turn is formed a second conductive layer 60 which is extensive on the insulating layer 58 in such a manner as to be completely isolated from the first conductive layer 56 which is in part exposed by the second insulating layer 58. On top of this second conductive layer 60 is carried a semiconductor integrated circuit chip 36 which has its substrate (not shown) bonded to the upper surface of the second conductive layer 60 with a layer 62 of an electrically conductive adhesive material such as a solder or a metal paste, as shown.

On the upper surface 36' of the semiconductor integrated circuit chip 36 opposite to the substrate are formed first and second supply electrodes 44 and 44'. The first supply electrode 44 is connected to the first lead portion 28 of the lead frame section 22 by means of a bonding wire 46 and the second supply electrode 44' is connected to the exposed portion 56a of the first conductive layer 56 by means of a bonding wire 46'. The semiconductor integrated circuit chip 36 has the various other electrodes of its bonding pads connected to the lead portions 30 and 30' of the lead frame section 22 by means of bonding wires 38.

Between the first and second supply electrodes 44, and 44' an electrically formed capacitance is implemented by the insulating layer 54 of the dielectric material which intervenes between the chip mounting portion 24 of the lead frame section and the first conductive layer 56. The capacitor which is formed in this fashion has one of its electrode plate constituted by the first conductive layer 56 and the other electrode plate constituted by the chip mounting portion 24 of the lead frame section 22 over that area of the chip mounting portion 24 which is coextensive with the conductive layer 56. Thus, the total structure shown in FIG. 6 constituting a semiconductor integrated circuit device with a built-in capacitor is then sealed in, for example, a body (not shown) of an electrically lowly conductive material, typically epoxy resin, to implement a desired capacitor built-in integrated circuit packaged unit.

A preferred example of a process of fabricating the capacitor built-in integrated circuit packaged unit thus constructed in accordance with the present invention will now be described. The process of fabrication starts with preparation of a lead frame including the above described lead frame section 22 having the single chip mounting portion 24, elongated strip portions 26 and 26', and two sets of outgoing lead portions 30 and 30' including first and second outgoing lead portions 28 and 28'. On the upper surface of the chip mounting portion 24 of the lead frame section 22 thus prepared is deposited the first insulating layer 54 of a highly dielectric material. The dielectric material to be used for this purpose may be any of oxides such as titanium oxide, aluminum oxide and barium titanate, any of nitrides such as silicon nitride, tantalum nitride and boron nitride, or a composite glass containing an appropriate element. The insulating layer 56 of any of these materials is formed preferably to a thickness of less than 3 microns to allow formation of a built-in capacitor with a satisfactorily large capacitance by the particular layer 56. As the deposition technique to be used for the formation of such a dielectric insulating layer 54 on the chip mounting portion 24 of the lead frame section 22 is preferred the vapor deposition method such as the physical vapor deposition (PVD) or the chemical vapor deposition (CVD) or the RF sputtering method, from the view point of forming the layer 56 with a satisfactory degree of uniformity throughout its area. Alternatively, the insulating layer 56 of the capacitor built-in integrated circuit packaged unit constructed as shown in FIG. 6 may be formed by depositing aluminum or tantalum on the upper surface of the chip mounting portion 24 of the lead frame section 22 and subsequently anodizing the resultant layer to convert the material into a dielectric substance or by a reactive insulating film forming method to form a film of a nitride such as tantalum nitride formed by a reactive sputtering technique.

On the surface of the first insulating layer 54 thus formed on the chip mounting portion 24 is deposited a metal firmly cohesive to the particular insulating layer such as, for example, titanium, aluminum, tantalum, chromium or nickel to form the first conductive layer 56, leaving the exposed area 54a on the upper surface of the insulating layer 54. The formation of the first conductive layer 56 may be effected by the physical or chemical vapor deposition method. Alternatively, this first conductive layer 56 may be formed by bonding a film of such a metal element to the surface of the insulating layer 54 with use of a suitable adhesive material or by the compression bonding of such a film to the surface of the layer 54. The first conductive layer 56 thus formed is in turn covered with the second insulating layer 58, leaving the exposed area 56a on the upper surface of the conductive layer 56. This second insulating layer 58 may be formed by the same method and/or with the same material as are used for the formation of the first insulating layer 54. Because, however, of the fact that the second insulating layer 58 has only to isolate the first and second conductive layers 65 and 68 from each other, the layer 58 may otherwise be formed simply by bonding a film of an adhesive material to the surface of the conductive layer 56. On the upper surface of the second insulating layer 58 in turn is formed the second conductive layer 60, which is completely isolated from the first conductive layer 56 which is in part exposed by the second insulating layer 58 as above mentioned. This second conductive layer 60 may be formed by the same method and/or with the same material as are used for the formation of the first conductive layer 56. On top of this second conductive layer 60 is placed the semiconductor semiconductor integrated circuit chip 36 which has its substrate (not shown) bonded to the upper surface of the second conductive layer 60 with the layer 62 of an electrically conductive adhesive material such as a solder or a metal paste. The semiconductor integrated circuit chip 36 has carried on its surface opposite to the substrate the first and second supply electrodes 44 and 44' which are to be wired to the chip mounting portion 24 of the lead frame section 22 and the second conductive layer 56, respectively.

In forming the layers 54, 56, 58 and 60 on the chip mounting portion 24 of the lead frame section 22 as above described, it is preferable that the individual layers be stacked in tiers as shown in FIG. 6, with the edges of each layer inboardly offset from the edges of the immediately underlying layer with the exception of the second insulating layer 58 with respect to the first conductive layer 56. Thus, the first conductive layer 56 has all of its edges offset from the edges of the first insulating layer 54 underlying the layer 56 and, likewise, the second conductive layer 60 has all of its edges offset from the edges of the second insulating layer 58 underlying the layer 60. Further preferably, the second conductive layer 60 has all of its edges offset from the edges of the first conductive layer 56 underlying the layer 60 across the second insulating layer 58. Accordingly, the second conductive layer 60 is less extensive than each of the first conductive layer 56 and the second insulating layer 58 and the first conductive layer 56 is less extensive than the first insulating layer 54. The second insulating layer 58 may partly extend beyond the edges of the first conductive layer 56 as indicated at 58a insofar as the layer 58 allows a portion of the first conductive layer 56 uncovered as at 56a. In order to realize such geometries of the layers 54, 56, 58 and 60, it is preferable that the single chip mounting portion 24 of the lead frame section 22 have a sufficiently ample area to accommodate the lowermost and accordingly most extensive first insulating layer 54 thereon. For the same purpose, the first and second insulating layers 54 and 58 may have portions 54b and 58b, respectively, extending far to the elongated strip portions 26 and 26' of the lead frame section 22 as shown in FIG. 5. If desired, not only the first and second insulating layers 54 and 58 but also the first conductive layer 56 underlying the second insulating layer 58 may have portions extending to the strip portions 26 and 26' of the lead frame section 22 although the insulating layer 58 is not shown as such in FIG. 5.

By virtue of these geometries of the layers 54, 56, 58 and 60, the electrically conductive adhesive layer 62 intervening between the second conductive layer 60 and the semiconductor integrated circuit chip 36 is precluded from contacting not only the exposed portion 56a of the first conductive layer 56 beyond the second insulating layer 58 but the chip mounting portion 24 of the lead frame section 22 far beyond the first insulating layer 54. This provides assurance of the first supply electrode 44 on the semiconductor integrated circuit chip 36 being isolated from the first conductive layer 56 and the second supply electrode 44' being isolated from the chip mounting portion 24 of the lead frame section 22. Where the second insulating layer 58 is formed with the portion 58a directly overlying the first insulating layer 54, the particular portion 58a of the insulating layer 58 is located below the bonding wire which is to extend from the first supply electrode 44 to the chip mounting portion 24 of the lead frame section 22. In this instance, the portion 58a of the insulating layer 58 serves to provide further assurance of the first supply electrode 44 on the semiconductor integrated circuit chip 36 being isolated from the first conductive layer 56 which is covered with the portion 58a below the bonding wire.

On the upper surface of the portion 56a of the first conductive layer 56 exposed by the second insulating layer 58 and the upper surface of the second conductive layer 60 may be provided an additional layer of metal such as nickel, aluminum, gold silver or the like, though not shown in the drawings. The additional layer of such a metal on the exposed portion 56a of the first conductive layer 56 will allow a bonding wire to be anchored assuredly to the particular portion 56a, while the additional metal layer on the second conductive layer 60 which per se is constructed of a metal firmly cohesive to the underlying second insulating layer 58 will allow the semiconductor integrated circuit chip 36 to assuredly attach to the conductive layer 60 through the electrically conductive adhesive layer 62. Each of these additional layers may be formed by deposition of any of the above mentioned substances or by the compression bonding of a film of such a substance onto the surface of the exposed portion 56a of the first conductive layer 56 or the upper surface of the second conductive layer 60. Where these additional layers of metal are to be formed by deposition, the substance selected for the formation of such layers may be also selectively deposited to form inner leads to be wire bonded to the outgoing lead portions of the lead frame section 22 so that the metallic layer for the inner leads which are to be typically formed by electroplating can be advantageously dispensed with.

The second conductive layer 60 may be dispensed with if a layer of a metal paste is used as the layer 62 of the electrically conductive adhesive material. In this instance, the second conductive layer 60 and the layer 62 of the conductive adhesive material are substituted by the single layer of the metal paste directly securing the semiconductor integrated circuit chip 36 to the second insulating layer 58. The second conductive layer 60 may also be dispensed with if a layer of an electrically insulating paste is used in lieu of the layer 62 of the electrically conductive adhesive material. If a layer of an electrically insulating paste is thus used in lieu of the layer 62, not only the second conductive layer 60 but also the second insulating layer 58 may be dispensed with so that the semiconductor integrated circuit chip 36 is bonded to the first conductive layer 58 directly by the single layer of the insulating paste. Where the second conductive layer 60 or both the second conductive layer 60 and the second insulating layer 58 are to be dispensed with in this fashion, it is preferable to have the lower surface of the substrate of the semiconductor integrated circuit chip 36 be coated with a metal such as gold or aluminum or as to stabilize the potential to be produced at the lower surface of the substrate. Such a coating of metal may be formed by deposition of gold or aluminum on the lower surface of the substrate of the chip 36.

The process of forming the integrated circuit packaged unit embodying the present invention further comprises the step of connecting the first supply electrode 44 to the first lead portion 28 of the lead frame section 22 by means of the bonding wire 46 and the second supply electrode 44' to the exposed portion 56a of the first conductive layer 56 by means of the bonding wire 46. The exposed portion 56a of the conductive layer 56 is in turn connected to the second lead portion 28' by means of a bonding wire 64 as shown in FIG. 5 and further in FIG. 7. The first supply electrode 44 is thus electrically connected to the chip mounting portion 24 of the lead frame section 22 through the bonding wire 46 and the first lead portion 28 of the lead frame section and the second supply electrode 44' is connected through the bonding wire 46', the exposed portion 56a of the first conductive layer 56 and the bonding wire 64 to the second lead portion 28' of the lead frame section which is separate from the chip mounting portion 24.

Figure 7:
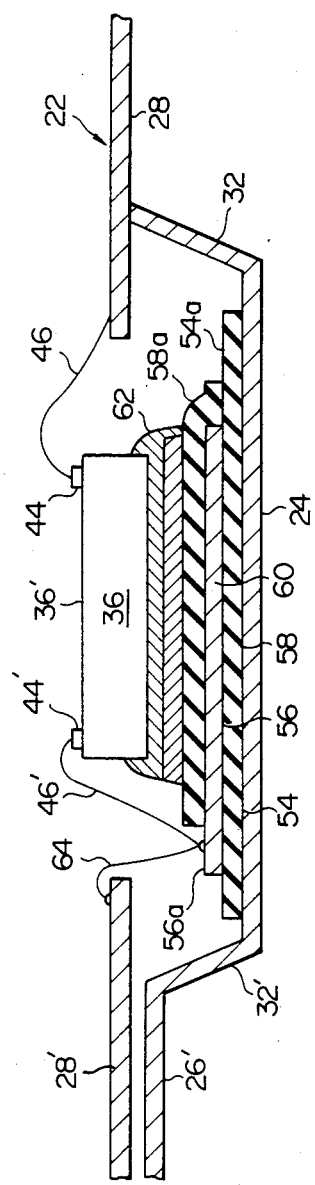
FIG. 7 is a sectional view showing the general construction of a further interim structure formed during the process of fabricating the capacitor built-in integrated circuit packaged unit provided by the first embodiment of the present invention.
Figure 8:
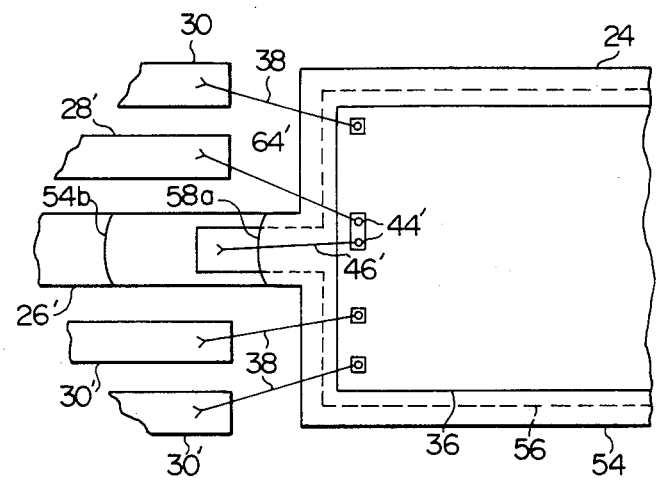
FIG. 8 is a fragmentary plan view showing part of a modification of the wire bonding arrangement used in the first embodiment of the present invention.

It is thus herein assumed that only one electrode is provided as the second supply electrode 44' on the upper surface of the semiconductor integrated circuit chip 36 is used for connection to the second lead portion 28' of the lead frame section 22 as shown in FIGS. 5 and 7. Alternatively, however, there may be provided two separate second supply electrodes 44' on the upper surface 36' of the semiconductor integrated circuit chip 36 as shown in FIG. 8 so that one of the electrodes 44' is used exclusively for providing connection to the exposed portion 56a of the first conductive layer 56 through the bonding wire 48' and the other used exclusively for providing connection to the second lead portion 28' through a bonding wire 64'. As will be further seen from FIG. 7, the strip portions 26 and 26' of the lead frame section 22 may step down immediately ahead of the chip mounting portion 24 as indicated at 32 and 32', respectively, so that the chip mounting portion 24 has its below the plane on which the frame section 22 lies.

The process of fabricating the integrated circuit packaged unit embodying the present invention further comprises the step or steps of connecting the various other electrodes of the semiconductor integrated circuit chip 36 to the lead portions 30 and 30' of the lead frame section 22 by means of bonding wires 38 as shown in FIG. 5. Upon completion of the wire bonding operation, the total structure shown in FIG. 7 constituting a semiconductor integrated circuit device with the built-in capacitor is sealed in, for example, a body of epoxy resin (not shown), thereby putting an end to the fabrication process to obtain the desired capacitor built-in integrated circuit packaged unit.

Figure 9:
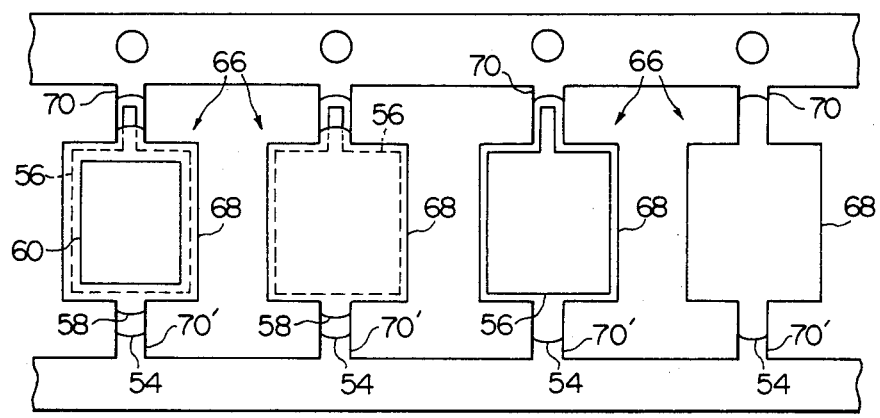
FIG. 9 is a fragmentary plan view showing a portion of a metal frame including a capacitor support portion which is to form part of a second preferred embodiment of a capacitor built-in integrated circuit packaged unit according to the present invention.
Figure 10:
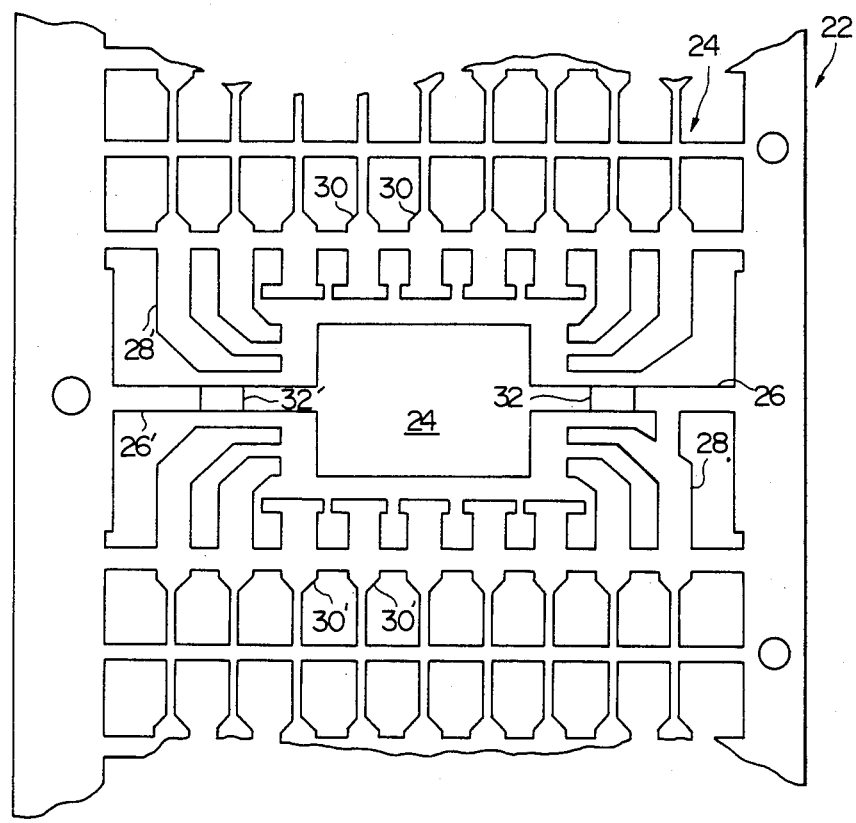
FIG. 10 is a fragmentary plan view showing a portion of a lead frame including a chip mounting portion which is also to form part of the second preferred embodiment of the present invention.
Figure 11:
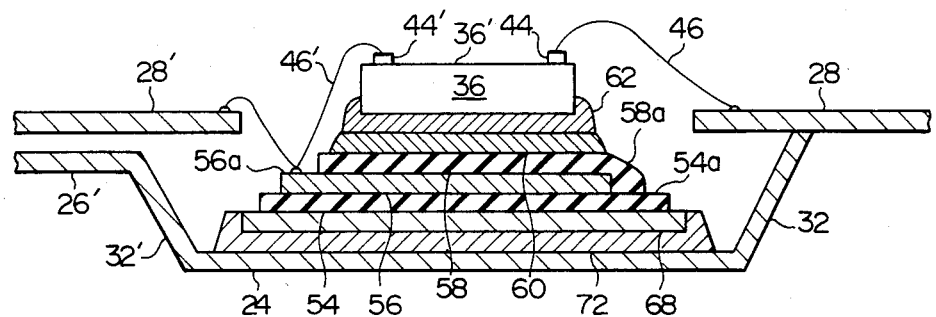
FIG. 11 is a sectional view showing the general construction of an interim structure formed during the process of fabricating the capacitor built-in integrated circuit packaged unit provided by the second embodiment of the present invention.

FIGS. 9 to 11 of the drawings show a second preferred embodiment of a capacitor built-in integrated circuit packaged unit according to the present invention and a preferred example of a process of fabricating such a packaged unit. For the fabrication of the capacitor built-in integrated circuit packaged unit provided by the second embodiment of the present invention, there are used two different metal frame consisting of an inner metal frame shown in FIG. 9 and an outer lead frame shown in FIG. 10.

The inner metal frame shown in FIG. 9 includes a flat metal frame section 66 having a single capacitor support portion 68 and a pair of elongated runner portions 70 and 70' extending in opposite directions to each other from the capacitor support portion 68. The outer lead frame shown in FIG. 10 is essentially similar in pattern to the lead frame shown in FIG. 5 and thus includes a generally flat metal frame section 22 having a single chip mounting portion 24, a pair of elongated strip portions 26 and 26' extending in opposite directions from the chip mounting portion 24, first and second outgoing lead portions 28 and 28', and two sets of outgoing lead portions 30 and 30' arranged in parallel on both sides of the chip mounting portion 24. The first lead portion 28 is connected to the chip mounting portion 24 through the strip portion 26 and the second lead portion 28' is assumed to be separate from the chip mounting portion 24 as shown. The strip portions 26 and 26' step down immediately ahead of the chip mounting portion 24 as indicated at 32 so that the chip mounting portion 24 has its below the plane on which the frame section 22 lies as will be better seen from FIG. 11.

The capacitor support portion 68, cut from the metal frame section 66 of the inner lead frame, is fixedly received on the upper surface of the chip mounting portion 24 of the lead frame section 22 by a layer 72 of an electrically conductive adhesive material such as a solder or a metal paste, as shown in FIG. 11. On the upper surface of the capacitor support portion 68 thus provided on the chip mounting portion 24 of the lead frame section 22 is formed a first insulating layer 54 of a highly dielectric material. This first insulating layer 54 has its upper surface covered with a first conductive layer 56, allowing the layer 56 to have at least one exposed portion 54a. The first conductive layer 56 in turn is covered with a second insulating layer 58, allowing the layer 58 to have at least one exposed portion 56a and an edge portion 58a lying directly on the exposed portion 54a of the first insulating layer 54. On the upper surface of the second insulating layer 58 in turn is formed a second conductive layer 60 which is completely isolated from the first conductive layer 56. On top of this second conductive layer 60 is fixedly mounted a semiconductor semiconductor integrated circuit chip 36 which has its substrate (not shown) bonded to the upper surface of the second conductive layer 60 with a layer 62 of an electrically conductive adhesive material such as a solder or a metal paste, as shown. On the upper surface 36' of the semiconductor integrated circuit chip 36 opposite to the substrate are formed first and second supply electrodes 44 and 44'. The first supply electrode 44 is connected to the first lead portion 28 of the lead frame section 22 by a bonding wire 46' and the second supply electrode 44' is connected to the exposed portion 56a of the first conductive layer 56 by a bonding wire 46. The structure composed of the layers 54, 56, 58 and 60 with the semiconductor semiconductor integrated circuit chip 36 mounted on the uppermost layer 60 is thus essentially similar to the multi-layer structure directly mounted on the chip mounting portion 24 of the lead frame section 22 in the embodiment shown in FIGS. 5 to 7. The geometries of the individual layers 54, 56. 58 and 60 forming the structure on the capacitor support portion 68 are similar to those described in connection with the particular multi-layer structure. Between the first and second supply electrodes 44 and 44' is therefore electrically formed a capacitance implemented by the insulating layer 54 of the dielectric material which intervenes between the capacitor support portion 68 and the first conductive layer 56. The capacitor thus formed has one of its electrode plate constituted by the first conductive layer 56 and the other electrode plate constituted by the capacitor support portion 68 of the lead frame section over that area of the capacitor support portion 68 which is coextensive with the conductive layer 56. The total structure shown in FIG. 11 constitutes a semiconductor integrated circuit device with a built-in capacitor and is sealed in, for example, a body of epoxy resin (not shown) to implement a capacitor built-in integrated circuit packaged unit.

A preferred example of a process of fabricating the capacitor built-in integrated circuit packaged unit thus constructed in accordance with the present invention will be hereinafter described. The process of fabrication starts with preparation of an inner metal frame including the above described frame section 66 having the capacitor support portion 68. On the capacitor support portion 68 of the frame section 66 thus prepared are successively stacked the first insulating layer 54 of a highly dielectric material deposited or otherwise formed on the upper surface of the capacitor support portion 68, the first conductive layer 56 deposited or otherwise formed on the upper surface of the first insulating layer 54, the second insulating layer 58 deposited or otherwise formed on the upper surface of the first conductive layer 56, and the second conductive layer 60 deposited or otherwise formed on the upper surface of the second insulating layer 58. The first insulating layer 54 has the portion 54a exposed by the first conductive layer 56 and the likewise the first conductive layer 56 has the portion 56a exposed by the second insulating layer 58. The second conductive layer 60 is completely isolated from the first conductive layer 56 which is thus in part exposed by the second insulating layer 58. All these layers 54, 56, 58 and 60 are formed by the same methods and/or with the same materials as are used for the formation of the multi-layer structure on the chip mounting portion 24 of the lead frame section 22 in the embodiment described with reference to FIGS. 5 to 7. The capacitor support portion 68 carrying the stack of the layers 54, 56, 58 and 60 is now cut from the metal frame section 66.

The outer lead frame includes the above mentioned lead frame section 22 having the chip mounting portion 24, elongated strip portions 26 and 26', and two sets of outgoing lead portions 30 and 30' including first and second outgoing lead portions 28 and 28'. The multi-layer structure consisting of the stack of the layers 54, 56, 58 and 60 on the capacitor support portion 68 is obtained as described above and then is placed on the chip mounting portion 24 of the lead frame section 22 with the capacitor support portion 68 bonded to the the upper surface of the chip mounting portion 24 of the lead frame section 22 with an electrically conductive adhesive material such as a solder or a metal paste. In mounting the structure on the chip mounting portion 24, a film of tin, gold or any solder may be formed on the lower surface of the capacitor support portion 68 prior to the fixation of the structure on the chip mounting portion 24, so as to provide improved cohesion between the capacitor support portion 68 and the chip mounting portion 24.

On top of the second conductive layer 60 of the structure thus obtained is placed the semiconductor semiconductor integrated circuit chip 36 which has its substrate (not shown) bonded to the upper surface of the second conductive layer 60 with the layer 62 of an electrically conductive adhesive such as a solder or a metal paste. On the upper surface 36' of the semiconductor integrated circuit chip 36 opposite to the substrate are formed the first and second supply electrodes 44 and 44'. The first supply electrode 44 is connected to the first lead portion 28 of the lead frame section 22 by means of the bonding wire 46 and the second supply electrode 44' to the exposed portion 56a of the first conductive layer 56 by means of the bonding wire 46. The exposed portion 56a of the conductive layer 56 is further connected to the second lead portion 28' partly through the bonding wire 46' as shown in FIG. 11 or directly by a bonding wire independent of the bonding wire 46' as described with reference to FIG. 8. The first supply electrode 44 is thus electrically connected to the chip mounting portion 24 of the lead frame section 22 through the bonding wire 46 and the first lead portion 28 of the lead frame section and the second supply electrode 44' is connected through the bonding wire 48', the exposed portion 56a of the first conductive layer 56 and the bonding wire 64 to the second lead portion 28' of the lead frame section which is separate from the chip mounting portion 24 as in the structure described with reference to FIGS. 5 to 7.

The process of fabricating the capacitor built-in integrated circuit packaged unit provided by the second embodiment of the present invention further comprises the step or steps of wire bonding the various other electrodes of the semiconductor integrated circuit chip 36 to the lead portions 30 and 30' of the lead frame section 22. Upon completion of the wire bonding operation, the total structure shown in FIG. 11 constituting a semiconductor integrated circuit device with the built-in capacitor is sealed in, for example, a body of epoxy resin (not shown), thereby putting an end to the fabrication process to obtain the desired capacitor built-in integrated circuit packaged unit.

The capacitor built-in integrated circuit packaged unit provided by the second embodiment of the present invention is useful for achieving all the advantages of the first embodiment of the invention. The former is however even more advantageous than the first embodiment of the invention in that a greater number of capacitor built-in integrated circuit devices can be formed over a given area when each of the first insulating and conductive layers 54 and 56 is to be formed by the physical or chemical deposition technique.

Figure 12:
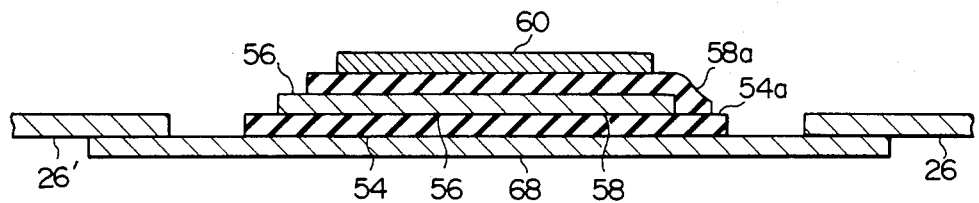
FIG. 12 is a sectional view showing the general construction of an interim structure formed during the process of fabricating the capacitor built-in integrated circuit packaged unit provided by a modification of the second embodiment of the present invention.

While it has been described in connection with the process of fabrication of the second embodiment of the present invention that the capacitor support portion 68 having the stack of the layers 54, 56, 58 and 60 formed in tiers thereon is to be mounted on the chip mounting portion 24 of the lead frame section 22, such a capacitor support portion may be fixed on a lead frame section devoid of a chip mounting portion. The lead frame section thus devoid of the chip mounting portion has a pair of strip portions 26 and 26' extending toward each other on both sides of an open space in which the chip mounting portion would otherwise be located as will be seen from FIG. 12. The capacitor support portion 68 having the layers 54, 56, 58 and 60 stacked thereon as above described is soldered, brazed or otherwise secured to these strip portions 26 and 26' of the lead frame section in such a manner that the stack of the layers 54, 56, 58 and 60 protrude upwardly through the above mentioned open space in which the chip mounting portion would otherwise be located. The capacitor support portion 68 to be used for this process or for carrying out the process of fabrication described with reference to FIGS. 9 to 11 may be provided in the form of an initially discrete flat metal plate rather than one of a series of metal plate portions of a single lead frame structure shown in FIG. 9. In whichsoever form of capacitor support portion may be used, a wide range of selection is open to the material operable for forming the capacitor support portion per se.

Figure 13:
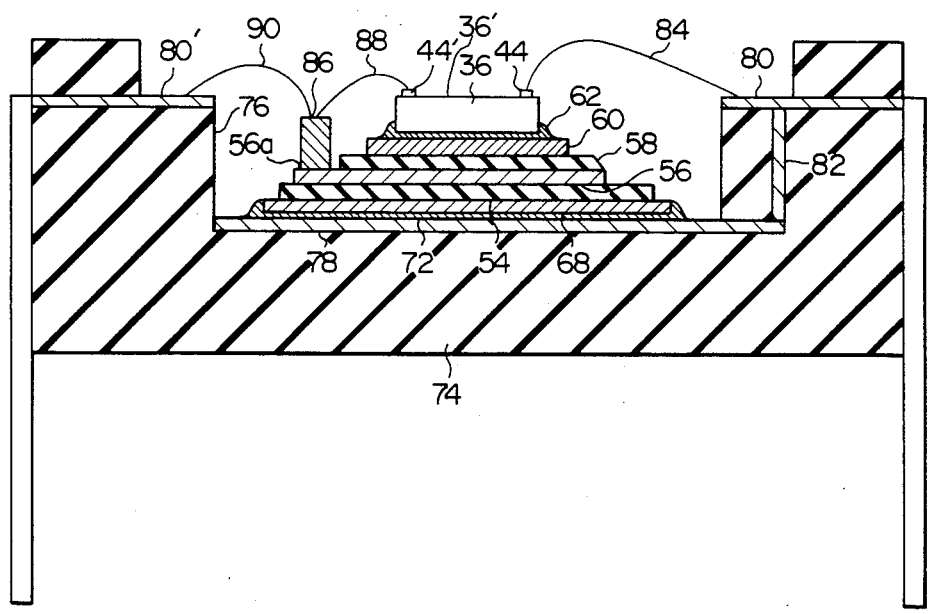
FIG. 13 is a sectional view showing the general construction of an interim structure formed during the process of fabricating the capacitor built-in integrated circuit packaged unit provided by a third embodiment of the present invention.

FIG. 13 of the drawings shows part of a third preferred embodiment of a capacitor built-in integrated circuit packaged unit according to the present invention. The capacitor built-in integrated circuit packaged unit herein shown is constructed in the form of a ceramic package and comprises a ceramic package case 74 having an upwardly open concavity 76 having a flat bottom surface. The ceramic package case 74 has a molybdenum or tungsten metallized layer 78 formed on this flat bottom surface of the concavity 76. The ceramic package case 74 further has two separate upper metallized layers 80 and 80' extending from side wall portions of the ceramic package case 74 and located on a plane parallel with the metallized layer 78 at the bottom of the concavity 76. One upper metallized layer 80 is electrically coupled to the metallized layer 74 at the bottom of the concavity 76 through a conductor 82 vertically extending through a through-hole formed in the ceramic package case 74 and constitutes a first supply lead of the package case 74. The other upper metallized layer 80 is electrically isolated from the metallized layer 78 at the bottom of the concavity 76 by the bulk ceramics forming the package case 74 and constitutes a second supply lead of the package case 74. A capacitor support portion 68 cut from the metal frame section 66 of a metal frame as shown in FIG. 9 is fixedly received on the upper surface of the metallized layer 78 by a layer 72 of an electrically conductive adhesive material such as a solder or a metal paste. On the upper surface of the capacitor support portion 68 thus provided on the metallized layer 78 of the ceramic package case 74 is formed a stack of a first insulating layer 54, a first conductive layer 56, a second insulating layer 58 and a second conductive layer 60. The resultant multilayer structure thus formed on the metallized layer 78 of the ceramic package case 74 is similar to the structure formed on the chip mounting portion 24 of the lead frame section 22 shown in FIG 11. Thus, the first conductive layer 56 has a portion 56a exposed by the second insulating layer 58.

On the upper surface of the second conductive layer 60 is fixedly mounted a semiconductor semiconductor integrated circuit chip 36 which has its substrate (not shown) bonded to the upper surface of the second conductive layer 60 with a layer 62 of an electrically conductive adhesive material such as a solder or a metal paste, as shown. The semiconductor integrated circuit chip 36 has on its upper surface first and second supply electrodes 44 and 44'. The first supply electrode 44 is electrically connected to the first supply lead of the package case 74 by a bonding wire 84. On the other hand, the second supply electrode 44' is electrically connected to the exposed portion 56a of the first conductive layer 56 by a conductive post 86 upstanding from the exposed portion 56a and a bonding wire 88 anchored at one end to the second supply electrode 44' and at the other to the conductive post 86. The second supply electrode 44' is further electrically connected to the second supply lead 80' of the ceramic package case 74 by means of a bonding wire 90 bridging the conductive post 86 and the second supply lead 80. It will be apparent that the conductive post 86 can be dispensed with if the bonding wires 88 and 90 are anchored directly to the exposed portion 56a of the first conductive layer 56, though not shown in the drawings. The structure composed of the layers 54, 56, 58 and 60 stacked on the capacitor support portion 68 on the metallized layer 78 with the semiconductor semiconductor integrated circuit chip 36 mounted on the uppermost layer 60 of the stack is thus essentially similar to the multi-layer structure directly mounted on the chip mounting portion 24 of the lead frame section 22 in the embodiment shown in FIGS. 5 to 7. The geometries of the individual layers 54, 56. 58 and 60 forming the structure on the capacitor support portion 68 are similar to those described in connection with the particular multilayer structure. Between the first and second supply electrodes 44 and 44' is therefore also electrically formed a capacitance implemented by the insulating layer 54 of the dielectric material which intervenes between the capacitor support portion 68 and the first conductive layer 56. The structure thus formed within the concavity 76 in the ceramic package case 74 is hermetically enclosed therein with a cap member (not shown) securely attached to the upper surface of the package case 74.

A preferred example of a process of fabricating the capacitor built-in integrated circuit packaged unit thus constructed in accordance with the present invention will be hereinafter described. The process of fabrication starts with preparation of the ceramic package case 74 and a metal frame including frame sections similar to the metal frame sections 66 illustrated in FIG. 9. On the capacitor mounting portion 68 of each of these metal frame sections are successively stacked the first insulating layer 54 on the capacitor support portion 68, the first conductive layer 56 on the first insulating layer 54, the second insulating layer 58 on the first conductive layer 56, and the second conductive layer 60 on the second insulating layer 58. All these layers 54, 56, 58 and 60 are formed by the same methods and/or with the same materials as are used for the formation of the multi-layer structure on the metallized layer 78 of the ceramic package case 74 in the embodiment described with reference to FIGS. 5 to 7. The capacitor support portion 68 carrying the stack of the layers 54, 56, 58 and 60 is now cut from the metal frame section.

The ceramic package case 74 prepared has the upwardly open concavity 76, the metallized layer 78 at the bottom of the concavity 76, and the first supply lead 80 electrically coupled to the metallized layer 74 the conductor 82 embedded in the ceramic package case 74, and the second supply lead 82' electrically isolated from the metallized layer 78. The capacitor support portion 68 supporting thereon the multilayer structure consisting of the stack of the layers 54, 56, 58 and 60 formed as described above is bonded to the upper surface of the metallized layer 78 of the ceramic package case 74 with the layer 72 of an electrically conductive adhesive material such as a solder or a metal paste. To the upper surface of the second conductive layer 60 of the structure thus mounted on the metallized layer 78 of the ceramic package case 74 is bonded the substrate (not shown) of the semiconductor semiconductor integrated circuit chip 36 with the layer 62 of an electrically conductive adhesive such as a solder or a metal paste. The first supply electrode 44 on the upper surface 36' of this semiconductor integrated circuit chip 36 is electrically connected to the first supply lead of the package case 74 by the bonding wire 84. The second supply electrode 44' on the chip 36 is electrically connected to the exposed portion 56a of the first conductive layer 56 by the conductive post 86 and the bonding wire 88 bridging the second supply electrode 44' and the conductive post 86. The second supply electrode 44' is further electrically connected to the second supply lead 80' of the ceramic package case 74 by means of the bonding wire 90 bridging the conductive post 86 and the second supply lead 80. A cap member is then securely attached to the upper surface of the package case 74 so that the structure formed within the concavity 76 in the ceramic package case 74 is enclosed therein, thereby putting an end to the fabrication process to obtain the capacitor built-in integrated circuit packaged unit according to the third embodiment of the present invention. It will be apparent that the process of fabrication as above described may be also applicable to the fabrication of a glass sealed package capacitor built-in integrated circuit packaged unit without major modification.

While it has been assumed in each of the embodiments described that the built-in capacitor provided in each embodiment is formed between supply electrodes, it will be apparent that one or each of the electrodes between which a built-in capacitor is to be formed in accordance with the present invention may be a ground electrode or a signal input or output electrode as the case may be.

From the foregoing description it will have been appreciated that the present invention provides the following major benefits.

(1) The built-in capacitor incorporated into an integrated circuit packaged unit lends itself to eliminating the noises which would otherwise be created between, for example, the supply and ground leads, thus precluding the occurrences of unwanted actions due to a production of such noises.

(2) Since the capacitor is not located outside the integrated circuit packaged unit, the device as a whole is adapted to achieve an increased packing density when used in a print-circuit assembly and the effect of the capacitor can be properly exploited in the absence of the inductance which would otherwise be induced by the lead wires between the capacitor and the integrated circuit device.

(3) The layer of the dielectric material to form part of the built-in capacitor can be formed with a sufficiently reduced thickness by the physical or chemical deposition technique so that the capacitor built-in integrated circuit packaged unit provides an enhanced reliability of performance with an increased resistance to thermal impact, uniformity of capacitances available by production on a commercial basis, and reduced possibilities of short circuits being formed between the electrode plates of the capacitor.

What is claimed is:

1. A capacitor built-in integrated circuit packaged unit comprising an electrically conductive support member having an extensive area larger than said capacitor, integrated circuit,
   (1) first and second lead elements associated with said conductive support member, said first lead element being electrically connected to said conductive support member and said second lead element being electrically isolated from said conductive support member,
   (2) a stack having a plurality of layers and comprising a first insulating layer of a highly dielectric material formed on said conductive support member, a first electrically conductive layer formed on said first insulating layer, said first insulating layer having a portion exposed by said first electrically conductive layer, a second insulating layer formed on said first electrically conductive layer and having a portion directly lying on the exposed portion of said first insulating layer, said first electrically conductive layer as a whole being less extensive than said first insulating layer and having a portion exposed by said second insulating layer, a second electrically conductive layer formed on said second insulating layer, said second electrically conductive layer as a whole being less extensive than said second insulating layer and than said first electrically conductive layer, and a layer of an electrically conductive adhesive material formed on the second electrically conductive layer,
   (3) a semiconductor integrated circuit chip having first and second electrodes which are electrically isolated from each other, said semiconductor integrated circuit chip having a surface portion bonded to said second electrically conductive layer via said electrically conductive adhesive material,
   (4) first coupling means electrically connecting the first electrode to said first lead element, and
   (5) second coupling means electrically connecting the second electrode to the exposed portion of said first electrically conductive layer and to said second lead element.

2. A capacitor built-in integrated circuit packaged unit as set forth in claim 1, wherein said exposed portion of said first electrically conductive layer has a layer of metal, to which said second coupling means is connected at one end thereof.

3. A capacitor built-in integrated circuit packaged unit as set forth in claim 1, wherein said second conductive layer has a layer of metal, to which said semiconductor integrated circuit chip is bonded.

4. A capacitor built-in integrated circuit packaged unit as set forth in claim 1, wherein said second insulating layer per se is constituted by a layer of an insulating adhesive material by means of which said semiconductor integrated circuit chip is bonded to said conductive layer.

5. A capacitor built-in integrated circuit packaged unit as set forth in claim 1, wherein said dielectric material is selected from the group consisting of titanium oxide, aluminum oxide and barium titanate.

6. A capacitor built-in integrated circuit packaged unit as set forth in claim 1, wherein said dielectric material is selected from the group consisting of silicon nitride, tantalum nitride and boron nitride.

7. A capacitor built-in integrated circuit packaged unit as set forth in claim 1, wherein said dielectric material is a composite glass.

8. A capacitor built-in integrated circuit packaged unit as set forth in claim 1, wherein said first insulating layer (56) is less than 30 microns thick.

9. A capacitor built-in integrated circuit packaged unit as set forth in claim 1, wherein said first electrically conductive layer is constructed of a material selected from the group consisting of titanium, aluminum, tantalum, chromium or nickel.

10. A capacitor built-in integrated circuit packaged unit as set forth in claim 1, wherein said second insulating layer is constructed of a material selected from the group consisting of titanium oxide, aluminum oxide and barium titanate.

11. A capacitor built-in integrated circuit packaged unit as set forth in claim 1, wherein said second insulating layer is constructed of a material selected from the group consisting of silicon nitride, tantalum nitride and boron nitride.

12. A capacitor built-in integrated circuit packaged unit as set forth in claim 1, wherein said second insulating layer is constructed of a composite glass.

13. A capacitor built-in integrated circuit packaged unit as set forth in claim 1, wherein said second conductive layer is constructed of a material selected from the group consisting of titanium, aluminum, tantalum, chromium or nickel.

14. A capacitor built-in integrated circuit packages unit as set forth in claim 1, wherein said second coupling means comprises a bonding wire electrically connecting said second electrode to the exposed portion of said first electrically conductive layer and a bonding wire electrically connecting said exposed portion to said second lead element.

15. A capacitor built-in integrated circuit packaged unit as set forth in claim 1, wherein said second coupling means comprises a bonding wire electrically connecting said second electrode to the exposed portion of said first electrically conductive layer and a bonding wire electrically connecting said second electrode direction to said second lead element.

16. A capacitor built-in integrated circuit packaged unit as set forth in claim 1, wherein said second coupling means comprises a conductive member fast on said exposed portion of said first electrically conductive layer, a bonding wire electrically connecting said second electrode to said conductive member and a bonding wire electrically connecting said conductive member to said second lead element.

17. A capacitor built-in integrated circuit packaged unit as set forth in claim 1, wherein said conductive support member and said first and second lead elements form part of a frame section of a lead frame of metal consisting of a series of frame sections.

18. A capacitor built-in integrated circuit packaged unit as set forth in claim 1, wherein said conductive support member constitutes a first conductive support member of two metallic support members which further includes a second conductive support member (68) to which said first conductive support member is bonded with an electrically conductive adhesive material.

19. A capacitor built-in integrated circuit packaged unit as set forth in claim 1, wherein said conductive support member is securely connected between said first and second lead elements.

20. A capacitor built-in integrated circuit packaged unit as set forth in claim 1, further comprising a body of a polymeric resin having said conductive support member, said stack of layers, said semiconductor integrated circuit chip and said first and second coupling means sealed therein.

21. A capacitor built-in integrated circuit packaged unit comprising an electrically conductive support member having an extensive area larger than said capacitor, integrated circuit,
  (1) first and second lead elements associated with said conductive support member, said first lead element being electrically connected to said conductive support member and said second lead element being electrically isolated from said conductive support member,
  (2) a stack having a plurality of layers comprising a first insulating layer of a highly dielectric material formed on said conductive support member, a first electrically conductive layer formed on said first insulating layer, said first insulating layer having a portion exposed by said first electrically conductive layer, a second insulating layer formed on said first electrically conductive layer and having a portion directly lying on the exposed portion of said first insulating layer, said first electrically conductive layer as a whole being less extensive than said first insulating layer and having a portion exposed by said second insultating layer, a second electrically conductive layer formed on said second insulating layer, said second electrically conductive layer as a whole being less extensive than said second insulating layer and than said first electrically conductive layer, and a layer of an electrically conductive adhesive material formed on the second electrically conductive layer,
  (3) a semiconductor integrated circuit chip having first and second electrodes which are electrically isolated from each other, said semiconductor integrated circuit chip having a surface portion bonded to said second electrically conductive layer via said electrically conductive adhesive material,
  (4) first coupling means electrically connecting the first electrode to said first lead element,
  (5) second coupling means electrically connecting the second electrode to the exposed portion of said first electrically conductive layer and to said second lead element,
  (6) a ceramic package case formed with a concavity having a bottom surface,
  (7) a metallized layer formed on the bottom surface, said first lead element being fastened onto said ceramic package case and electrically connected to said metallized layer,
  (8) said second lead element being fastened onto said ceramic package case and electrically isolated from said metallized layer,
  (9) said conductive support member being bonded to said metallized layer with an electrically conductive adhesive material, and
  (10) a cap member attached to said ceramic package case and closing said concavity.

22. A capacitor built-in integrated circuit packaged unit as set forth in claim 21, wherein said second coupling means comprises a conductive member fast on said exposed portion of said first electrically conductive layer, a bonding wire electrically connecting said second electrode to said conductive member and a bonding wire electrically connecting said conductive member to said second lead element.

* * * * *